US005608751A

United States Patent [19]
Shimoyama et al.

[11] Patent Number: 5,608,751
[45] Date of Patent: Mar. 4, 1997

[54] LASER DIODE AND PROCESS FOR PRODUCING THE SAME

[75] Inventors: Kenji Shimoyama, Tsuchiura; Toshinari Fujimori, Inashiki-gun; Satoru Nagao; Hideki Gotoh, both of Tsuchiura, all of Japan

[73] Assignee: Mitsubishi Chemical Corporation, Osaka, Japan

[21] Appl. No.: 209,963

[22] Filed: Mar. 14, 1994

[30] Foreign Application Priority Data

Mar. 16, 1993 [JP] Japan .................................. 5-055692

[51] Int. Cl.⁶ ........................................................ H01S 3/19
[52] U.S. Cl. ................................................ 372/46; 372/45
[58] Field of Search ....................................... 372/45, 46

[56] References Cited

U.S. PATENT DOCUMENTS 5,065,404  11/1991  Okajima et al. ............................ 372/46
5,153,889  10/1992  Sugawara et al. ......................... 372/45

FOREIGN PATENT DOCUMENTS

0373933A2  6/1990  European Pat. Off. .
0384756    8/1990  European Pat. Off. .
0408373A2  1/1991  European Pat. Off. .
0440471A3  8/1991  European Pat. Off. .
56-064489  1/1981  Japan .
3227090    8/1991  Japan .
5160503    6/1993  Japan .

OTHER PUBLICATIONS

Tanaka, H. et al, "Refractive indices ... matched to GaAs", J. Appl. Phys. 59(3), 1 Feb. 1986, pp. 985–986.
Adachi, Sadao, "GaAs, AlAs and $Al_xGa_{1-x}As$: Material parameters for use in research and device applications", J. App. Phys 58(3), 1 Aug. 1985, pp. R1–R29.
K. Shimoyama, et al., Novel selective area growth of AlGaAs and AlAs with HCl gas by MOVPE, pp. 235–242; Journal of Crystal Growth 124 (1992) North–Holland, (no month).

*Primary Examiner*—James W. Davie
*Attorney, Agent, or Firm*—David G. Conlin; Peter F. Corless

[57] ABSTRACT

The disclosure describes a laser diode comprising a Group III-V compound single-crystal substrate of first conduction type; a first cladding layer of first conduction type composed of $(Al_mGa_{1-m})_nIn_{1-n}P$ ($0.3 \leq m \leq 1$ and $0.3 \leq n \leq 0.75$) and formed on said single-crystal substrate; an active layer composed of $(Al_xGa_{1-x})_yIn_{1-y}P$ ($0 \leq x \leq 0.5$ and $0.3 \leq y \leq 0.75$) and formed on said first cladding layer; a second cladding layer of second conduction type composed of $(Al_mGa_{1-m})_nIn_{1-n}P$ ($0.3 \leq m \leq 1$ and $0.3 \leq n \leq 0.75$) and formed on said active layer and having a ridge; and a current blocking layer composed of $Al_uGa_{1-u}As_vP_{1-v}$, ($0 \leq u \leq 1$ and $0 \leq v \leq 1$) and so formed as to contact the lateral side of the ridge of said second cladding layer, (1) each refractive index of the first and second cladding layers being smaller than that of the active layer and (2) the refractive index of the current blocking layer being smaller than that of the second cladding layer.

16 Claims, 4 Drawing Sheets

LASER DIODE AND PROCESS FOR PRODUCING THE SAME

BACKGROUND OF THE INVENTION

The present invention relates to a laser diode which is low in threshold current and stabilized in transverse mode, and a process for producing such a laser diode.

Recently, in order to improve recording density of the recording devices such as optical discs, short wavelength laser diodes have been developed as a light source for writing/reading. For example, laser diodes having oscillation wavelength of 630–670 nm have been produced by forming a double heterostructure with $(Al_xGa_{1-x})_{0.5}In_{0.5}P$. As a typical example of such short wavelength laser diodes, there is known one in which a current blocking layer is formed with GaAs.

However, use of GaAs for forming the current blocking layer causes problems of enlarged threshold current and reduced stability of the transverse mode.

On the other hand, use of a compound with high Al ratio, such as AlAs with small refractive index, for forming the current blocking layer has not yet been realized since it has the difficult problems such as deposition of polycrystals on the mask during selective epitaxial growth.

Also, in case of using a compound of $(Al_xGa_{1-x})_{0.5}In_{0.5}P$ for forming the current blocking layer, with a high Al compositional ratio as compared with the cladding layers, it is impossible to enhance the difference of the refractive index between the current blocking layer and the cladding layers, and there is a problem that the heat resistance of the laser diode is markedly raised.

Thus, the conventional laser diodes were unsatisfactory, in respects of light output and reliability, for use as a light source for information processing devices such as optical discs.

As a result of the present inventors' studies for solving the above-mentioned defects, it has been found that by forming successively a first cladding layer of first conduction type, an active layer and a second cladding layer of second conduction type on a Group III-V compound single-crystal substrate of first conduction type by a vapor-phase epitaxy method; etching the second cladding layer to form a ridge; and forming a current blocking layer at the lateral side of the ridge by vapor-phase epitaxy method, a small amount of HCl being added to a vapor-phase epitaxial gas for during epitaxy of the current blocking layer, a laser diode wherein the difference of refractive index in the transverse direction is sufficiently large and the threshold current is sufficiently small has been obtained. On the basis of the finding, the present invention has been attained.

SUMMARY OF THE INVENTION

The object of the present invention is to provide a laser diode which enables significant reduction of threshold current and stabilized control of transverse mode.

To accomplish the above aim, in a first aspect of the present invention, there is provided a laser diode comprising a Group III-V compound single-crystal substrate of first conduction type, a first cladding layer of first conduction type composed of $(Al_mGa_{1-m})_nIn_{1-n}P$ ($0.3 \leq m \leq 1$ and $0.3 \leq n \leq 0.75$) and formed on the said single-crystal substrate, an active layer composed of $(Al_xGa_{1-x})_yIn_{1-y}P$ ($0 \leq x \leq 0.5$ and $0.3 \leq y \leq 0.75$) and formed on the said first cladding layer, a second cladding layer of second conduction type composed of $(Al_mGa_{1-m})_nIn_{1-n}P$ ($0.3 \leq m \leq 1$ and $0.3 \leq n \leq 0.75$) and formed on the said active layer and having a ridge, and a current blocking layer composed of $Al_uGa_{1-u}As_vP_{1-v}$ ($0 \leq u \leq 1$ and $0 \leq v \leq 1$) and formed in contact with the lateral side of the ridge of the said second cladding layer, (1) each refractive index of the first and second cladding layers being smaller than that of the active layer and (2) the refractive index of the current blocking layer being smaller than that of the second cladding layer.

In a second aspect of the present invention, there is provided a process comprising the steps of forming successively a first cladding layer of first conduction type, an active layer and a second cladding layer of second conduction type on a Group III-V compound single-crystal substrate of first conduction type; etching the second cladding layer to form a ridge; and forming a current blocking layer at the lateral side of the ridge by vapor-phase epitaxy method, a small amount of HCl being added into the vapor-phase epitaxial gas during epitaxy of the current blocking layer.

DETAILED DESCRIPTION OF THE INVENTION

First, one of the conventional laser diodes is described with reference to FIG. 2 for facilitating understanding of the present invention.

Figure 2:
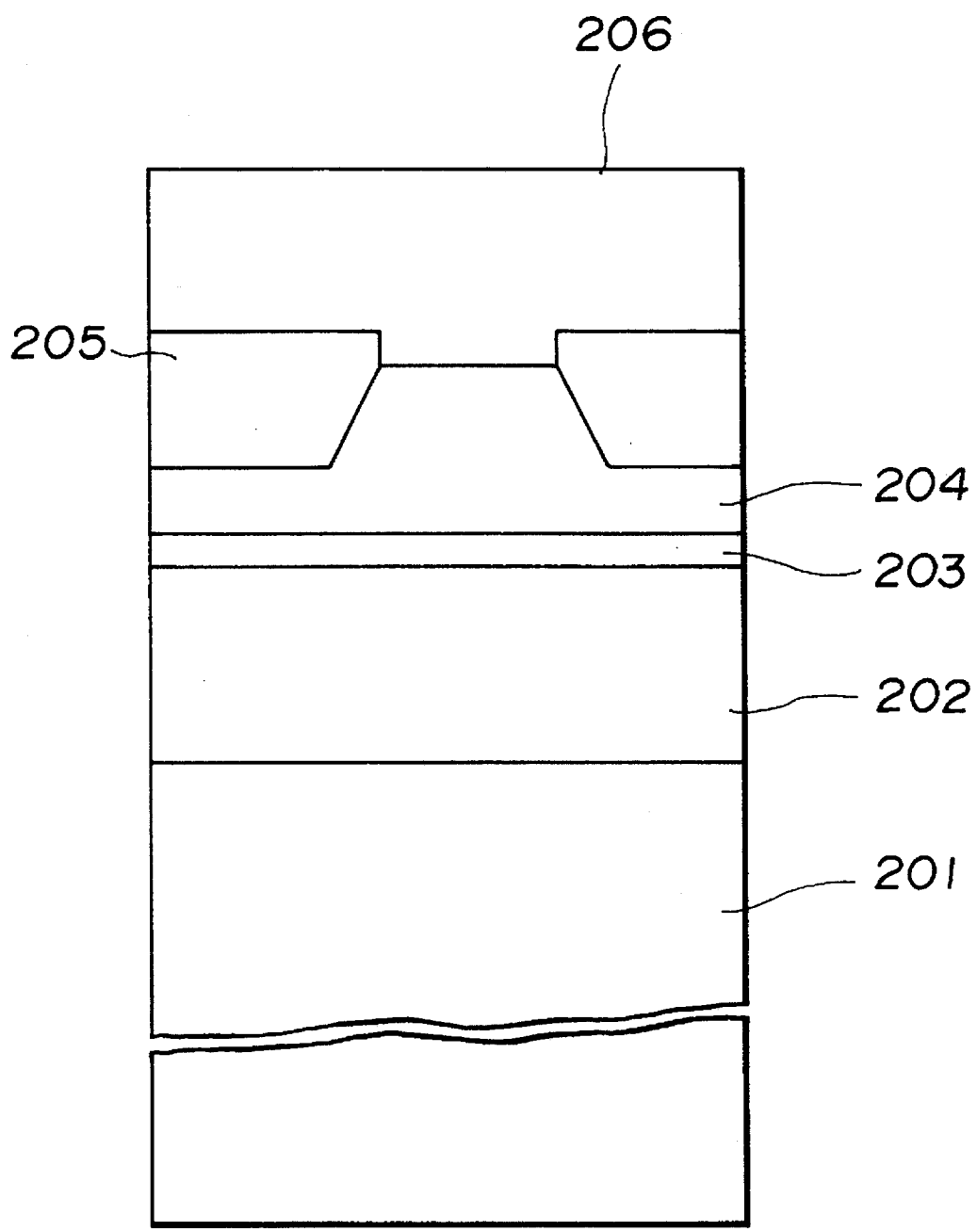
FIG. 2 is a schematic structural illustration of a conventional short wavelength laser diode.

The laser diode shown in FIG. 2 is produced by forming on an n-type GaAs substrate 201 a cladding layer 202 composed of n-type $(Al_{0.7}Ga_{0.3})_{0.5}In_{0.5}P$, forming on the said cladding layer 202 an active layer 203 composed of $Ga_{0.5}In_{0.5}P$, further forming thereon another cladding layer 204 composed of p-type $(Al_{0.7}Ga_{0.3})_{0.5}In_{0.5}$, etching selectively the said cladding layer 204 to form a ridge, forming a current blocking layer 205 composed of GaAs by selective epitaxy method so as to contact the lateral side of the ridge of the said cladding layer 204, and forming a p-type GaAs contact layer 206 on the top surfaces of the said current blocking layer 205 and the said ridge. The active layer 203 is sandwiched between the cladding layers 202 and 204 to constitute a double heterostructure. The current blocking layer 205 composed of GaAs is provided for obtaining a current density necessary for laser oscillation, i.e., for effecting current constriction, and for making a fundamental transverse-mode in the direction along the junction plane. In the conventional laser diodes in which the current blocking layer is composed of GaAs, there takes place much loss due to light absorption in the GaAs layer and no sufficient difference of refractive index is provided in the transverse direction, resulting in a large threshold current and reduced stability of the transverse mode.

Figure 1:
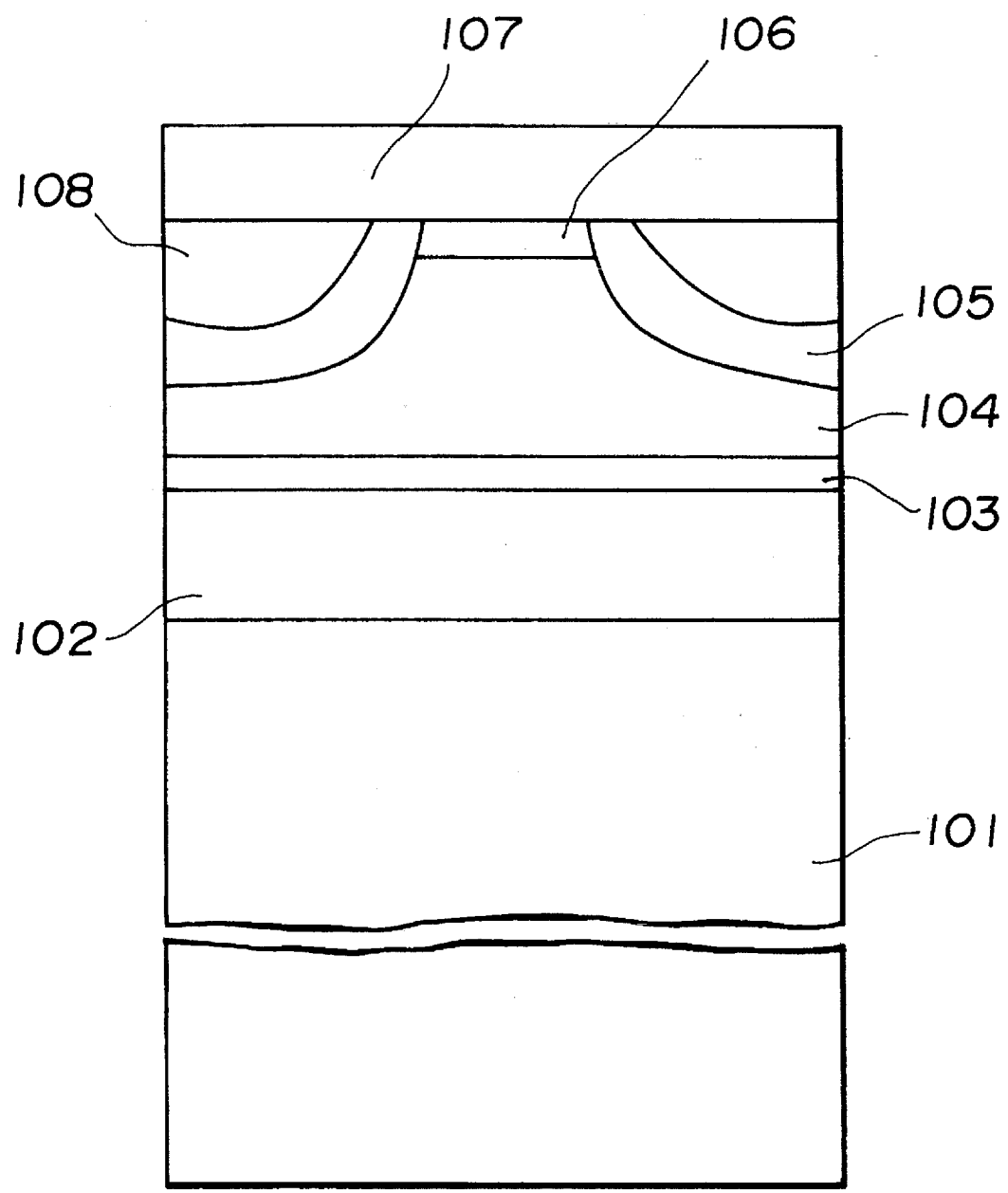
FIG. 1 is a schematic structural illustration of the laser diode according to the present invention.

Now, the laser diode according to the present invention is described with reference to FIG. 1.

In the laser diode of the present invention, usually a single-crystal substrate composed of GaAs, GaP or the like is used as Group III-V compound single-crystal substrate 101, but it is recommended to use a substrate composed of $GaAs_wP_{1-w}$ ($0.6 \leq w \leq 1$). As for the conduction type of the single-crystal substrate 101, usually n-type conduction is selected.

A first cladding layer 102 of the first conduction type is formed on a single-crystal substrate 101. The refractive index of the said first cladding layer 102 should be smaller than that of the active layer 103 described later. This is essential for efficient confinement of light generated in the active layer 103. The first cladding layer is composed of $(Al_mGa_{1-m})_nIn_{1-n}P$ ($0.3 \leq m \leq 1$ and $0.3 \leq n \leq 0.75$), preferably $(Al_zGa_{1-z})_{0.5}In_{0.5}P$ ($0.6 \leq z \leq 1$), for example, $(Al_{0.7}Ga_{0.3})_{0.5}In_{0.5}P$. The conduction type of the first cladding layer is the same as the substrate 101.

An active layer 103 is formed on the first cladding layer 101 to serve as a laser oscillating section. This active layer 103 is composed of $(Al_xGa_{1-x})_yIn_{1-y}P$ ($0 \leq x \leq 0.5$ and $0.3 \leq y \leq 0.75$), preferably $Ga_{0.5}In_{0.5}P$. The active layer 103 is usually reduced in impurity concentration and forms p-n junction with the first and second cladding layers. The active layer 103 may be used as a first or second conduction type to form p-n junction with the first or second cladding layer.

A second cladding layer 104 of the second conduction type is formed on the said active layer 103. This second cladding layer 104 has a ridge formed by selectively etching at least the upper portion of the said second cladding layer 104. The ridge has the function to induce "current constriction" necessary for laser oscillation. The "upper portion" of the second cladding layer 104 refers to the surface side of the epitaxial layer, that is, the surface side opposite from the single-crystal substrate 101. The refractive index of the second cladding layer 104 should be greater than that of the active layer 103. This is essential for efficient confinement of light generated in the active layer 103. The second cladding layer 104 is composed of the same material as the first cladding layer, but the composition may be changed within the range satisfying the above-shown chemical formula defining the material of the first cladding layer. The conduction type of the second cladding layer 104, which is herein referred to as second conduction type, should be different from that of the substrate 101 and the first cladding layer 102, and usually p-type is selected.

A current blocking layer 105 is provided for inhibiting the electric current flowing through this layer, thus effecting "current constriction" so as to obtain a current density necessary for laser oscillation and make a fundamental transverse-mode in the direction along the junction plane. This current blocking layer 105 is so formed as to contact the lateral side of the ridge of the second cladding layer 104. It is essential that the refractive index of the said current blocking layer 105 be smaller than that of the second cladding layer 104 for inhibiting bleeding of light from the second cladding layer 104. The current blocking layer 105 is composed of $Al_uGa_{1-u}As_vP_{1-v}$ ($0 \leq u \leq 1$ and $0 \leq v \leq 1$), preferably $Al_sGa_{1-s}As$ ($0.75 \leq s \leq 1$). As for the conduction type of the current blocking layer 105, it is preferred that the first conduction type is selected, because this enables formation of p-n reverse junction to allow secure blockade of current.

The difference in refractive index between the said layers can not be decided immediately since it differs depending on various factors such as active layer thickness, ridge width, residual thickness of cladding layers, etc. Usually, however, the difference in refractive index between first cladding layer 102 and active layer 103 is not less than 0.100, preferably not less than 0.200, the difference in refractive index between second cladding layer 104 and active layer 103 is not less than 0.100, preferably not less than 0.200, and the difference in refractive index between second cladding layer 104 and current blocking layer 105 is not less than 0.005, preferably not less than 0.050. The refractive index referred to above is the value of effective refractive index for the light with oscillation wavelength of the laser diode.

By using a compound of $Al_uGa_{1-u}As_vP_{1-v}$ for forming the current blocking layer, the difference of the refractive index between the current blocking layer and the cladding layer is raised as compared with the case of using a compound of $(Al_xGa_{1-x})InP$.

In the laser diode of the present invention, there may be additionally provided a cap layer 106, a contact layer 107 and a protective layer 108. These layers are provided for the purpose of protecting the current blocking layer 105 or reducing ohmic resistance of the electrodes. In the laser diode of the present invention, the thicknesses of said respective layers are usually selected from the ranges defined below:

First cladding layer 102: 0.2 to 3.0 μm;

Active layer 103: 0.002 to 0.2 μm;

Second cladding layer 104: 0.2 to 3.0 μm;

Current blocking layer 105: 0.1 to 3.0 μm;

Cap layer 106: 0.002 to 3.0 μm;

Contact layer 107: 0.01 to 100 μm; and

Protective layer 108: 0.005 to 3.0 μm.

There is no limitation of a production method of the laser diode in the present invention, but a Molecular-Beam Epitaxy method (MBE method) and a Metallo-Organic Chemical Vapor Deposition method (MOCVD method) are preferred in view of the precise control of the composition of the layers and layer thickness. Also, in the vapor-phase epitaxy method, for instance, the MOCVD method, when a small amount of hydrogen chloride (HCl) is mixed in the gas for vapor-phase epitaxy during selective growth of the current blocking layer 105 according to the process of the present invention, since there take place no deposition of polycrystals on the protective layer composed of silicon nitride (SiNx), etc. and formed on the second cladding layer 104, it is possible to form a high-quality current blocking layer from a compound with a high Al molar ratio such as AlAs, whose selective growth has been considered to be difficult in the past. As a result, there is provided a sufficient difference of refractive index in the transverse direction. The concentration of hydrogen chloride (HCl) in the gas for vapor-phase epitaxy, although variable depending on the concentration of gas for vapor-phase epitaxy in the carrier gas, is usually selected from within the range of 1 to 5,000 ppm based on the atmospheric gas concentration, viz., based on the total amount of gas for vapor-phase epitaxy and carrier gas.

In the laser diode of the present invention, since a sufficiently large difference of refractive index is obtained in the transverse direction, the transverse mode is stabilized and the threshold current can be reduced. Since the heat resistance of the laser diode is small, it is possible to accomplish a high output, a high reliability, etc. Consequently, light output of the diode can be increased and the diode can be applied advantageously to the optical disc devices with high recording density.

The laser diode of the present invention has the following technical advantages.

It is generally considered desirable for extending life of a laser diode to decrease the compositional ratio of Al which is susceptible to oxidation. On the contrary, the increase of the compositional ratio of Al and P causes the reduction of the refractive index. In the laser diode of the present invention, since the current blocking layer is composed of $Al_uGa_{1-u}As_vP_{1-v}$ ($0 \leq u \leq 1$ and $0 \leq v \leq 1$), it is possible to reduce the Al ratio in the current blocking layer without greatly varying the value of refractive index, by employing the lowering tendency of refractive index due to presence of P, and thus a remarkably long life of the laser diode can be realized.

EXAMPLES

The present invention will hereinafter be described more particularly with reference to a example. It is to be understood, however, that this example is given for the purpose of illustration only, and are not to be construed as limiting the scope of the invention in any way.

EXAMPLE 1

An epitaxial wafer used in production of the laser diode of the present invention was produced by low pressure MOCVD method according to the procedure shown in FIG. 3. The refractive index shown below is the value of effective refractive index for the light with oscillation wavelength of 670 nm.

Figure 3A:
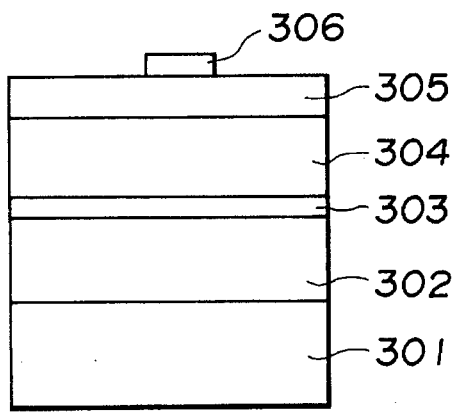
FIG. 3(a) to FIG. 3(d) illustrate the sequential steps for producing an epitaxial wafer used in production of the laser diode according to the present invention.

First, as shown in FIG. 3(a), on an n-type GaAs substrate 301 (dopant: Si; carrier concentration: $1 \times 10^{18}$ cm$^{-3}$) was epitaxially grown a first cladding layer 302 composed of n-type $(Al_{0.7}Ga_{0.3})_{0.5}In_{0.5}P$ (dopant: Si; carrier concentration: $1 \times 10^{18}$ cm$^{-3}$; refractive index: 3.37) to a thickness of 1.5 μm.

On the said first cladding layer 302 was epitaxially grown an undoped active layer 303 composed of $Ga_{0.5}In_{0.5}$ (refractive index: 3.65) to a thickness of 0.07 μm.

On the said active layer 303 was further epitaxially grown a second cladding layer 304 composed of p-type $(Al_{0.7}In_{0.3})_{0.5}In_{0.5}P$ (dopant: Zn; carrier concentration: $7 \times 10^{17}$ cm$^{-3}$; refractive index: 3.37) to a thickness of 1.5 μm.

On the said second cladding layer 304 was epitaxially grown a cap layer composed of p-type $Ga_{0.5}In_{0.5}P$ (dopant: Zn; carrier concentration: $1 \times 10^{18}$ cm$^{-3}$) to a thickness of 0.02 μm.

Figure 3B:
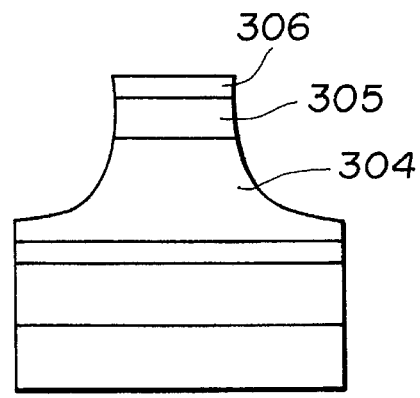

Then, in order to form a ridge, a SiNx film 306 was formed at the portion of the cap layer 305 where the ridge was to be formed, and the second cladding layer 304 and the cap layer 305 were etched. By this etching, the thickness of other portion than the ridge of the second cladding layer 304 was reduced to 0.15 μm, and as a result, a ridge such as shown in FIG. 3(b) was formed.

Figure 3C:
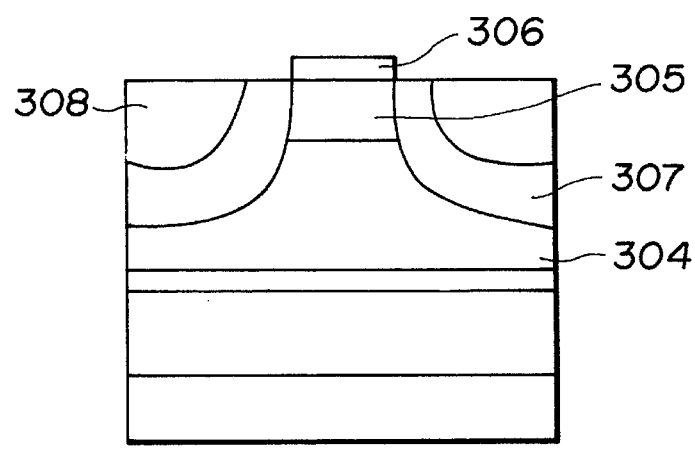

The wafer with a ridge thus formed was set in an MOCVD apparatus, and a current blocking layer 307 composed of n-type AlAs (dopant: Si; carrier concentration: $1 \times 10^{18}$ cm$^{-3}$; refractive index: 3.10) was epitaxially grown at the lateral side of the ridge including the cap layer 305 and on the etched layer 304 to a thickness of 0.8 μm as shown in FIG. 3(c). In this operation, a small amount of HCl was mixed in the gas used for the epitaxy method. The concentration of HCl was 100 ppm based on the atmospheric gas concentration, namely the total amount of gas for epitaxial growth and carrier gas. By mixing HCl, it was possible to prevent deposition of polycrystals of AlAs, etc., on the SiNx film 306.

On the said current blocking layer 307 was epitaxially grown an n-type GaAs protective layer 308 (dopant: Si; carrier concentration: $3 \times 10^{18}$ cm$^{-3}$) to a thickness of 0.2 μm.

Figure 3D:
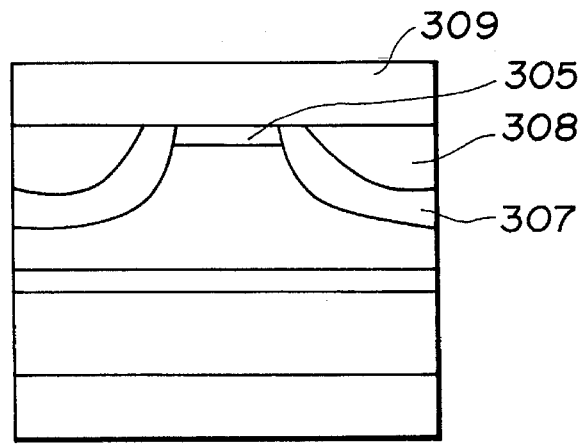

Then, as shown in FIG. 3(d), the SiNx film 306 was removed and a p-type GaAs contact layer 309 (dopant: Zn; carrier concentration: $3 \times 10^{18}$ cm$^{-3}$) was epitaxially grown to a thickness of 2 μm to obtain an epitaxial wafer according to the present invention.

Figure 4:
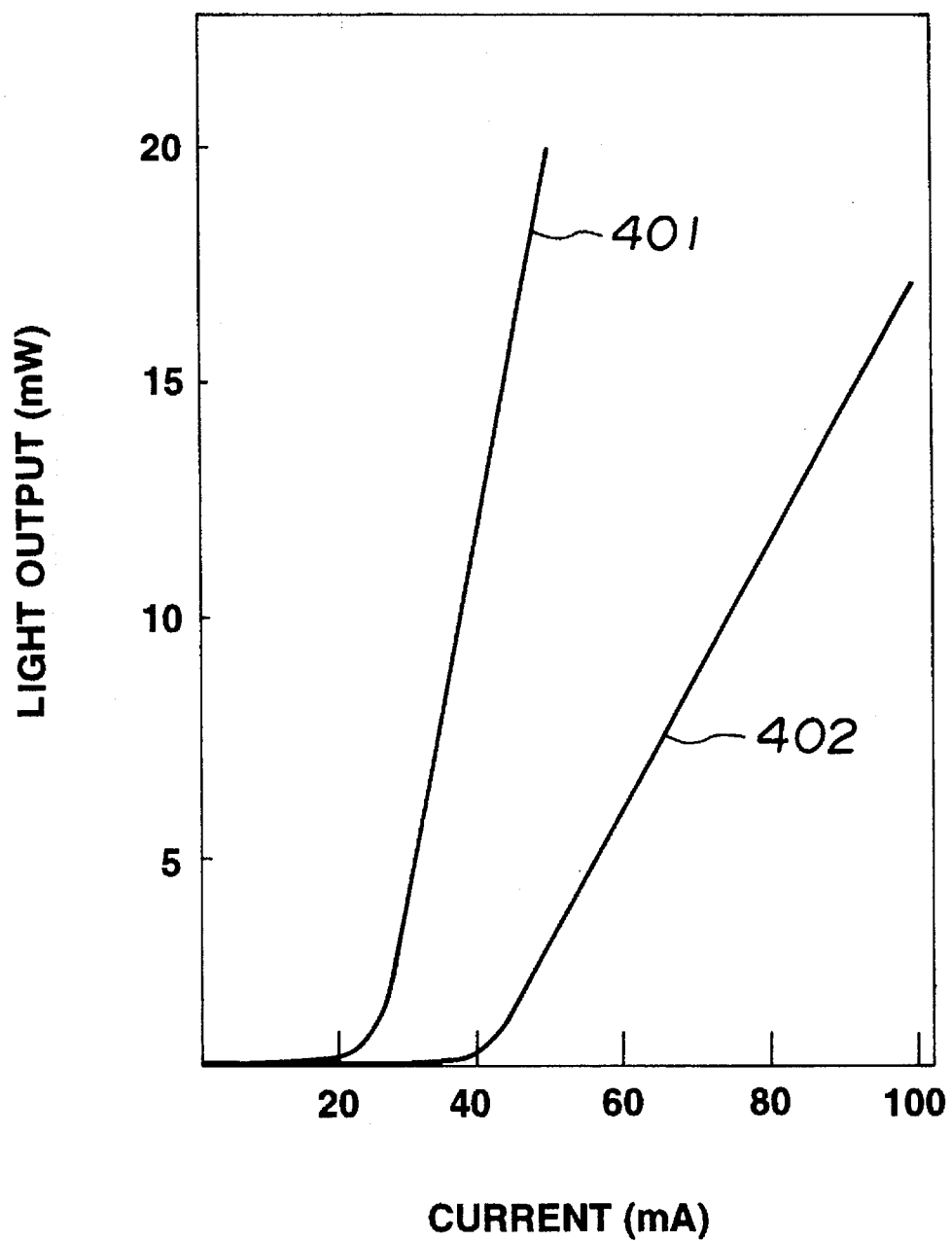
FIG. 4 is a graph showing the light output characteristics of the laser diode.

The electrodes were provided to the obtained epitaxial wafer, followed by dicing and cleavage to form the Fabry-Perot plane to produce a laser diode. The oscillation wavelength of this laser diode was 670 nm and its current-light output characteristics were as shown by curve 401 in FIG. 4. Curve 402 represents the current-light output characteristics of a conventional laser diode in which an n-GaAs layer is used as current blocking layer.

The characteristics of the laser diode of the present invention were as follows:

Threshold current (Ith)=25 mA;

Slope efficiency (SE) on one side=0.46 W/A;

both being measured under uncoated condition. Light output was COD 100 mW, and the transverse mode was stable up to 70 mW.

In said conventional laser diode using an n-GaAs laser as current blocking layer, Ith was 45 mW and SE was 0.24 W/A.

What is claimed is:

1. A laser diode comprising a Group III-V compound single-crystal substrate of first conduction type; a first cladding layer of first conduction type composed of $(Al_mGa_{1-m})_nIn_{1-n}P$ ($0.3 \leq m \leq 1$ and $0.3 \leq n \leq 0.75$) and formed on said single-crystal substrate; an active layer composed of $(Al_xGa_{1-x})_yIn_{1-y}P$ ($0 \leq x \leq 0.5$ and $0.3 \leq y \leq 0.75$) and formed on said first cladding layer; a second cladding layer of second conduction type composed of $(Al_mGa_{1-m})_nIn_{1-n}P$ ($0.3 \leq m \leq 1$ and $0.3 \leq n \leq 0.75$) and formed on said active layer and having a ridge; and a current blocking layer composed of $Al_uGa_{1-u}As_vP_{1-v}$, ($0 \leq u \leq 1$ and $0 \leq v \leq 1$) and so formed as to contact the lateral side of the ridge of said second cladding layer, (1) each refractive index of the first and second cladding layers being smaller than that of the active layer and (2) the refractive index of the current blocking layer being smaller than that of the second cladding layer.

2. A laser diode according to claim 1, wherein the difference of the refractive index between the first cladding layer and the active layer is not less than 0.100, the difference of the refractive index between the second cladding layer and the active layer is not less than 0.100, and the difference of the refractive index of the current blocking layer and the second cladding layer is not less than 0.005.

3. A laser diode according to claim 1, wherein the substrate is composed of $GaAs_wP_{1-w}$, ($0.6 \leq w \leq 1$).

4. A laser diode according to claim 1, wherein the active layer is 0.002 to 0.2 μm in thickness, the first and second cladding layers are 0.2 to 3.0 μm in thickness, and the current blocking layer is 0.1 to 3.0 μm in thickness.

5. A laser diode according to claim 2, wherein said current blocking layer is composed of $Al_sGa_{1-s}As$ ($0.75 \leq s \leq 1$).

6. A laser diode according to claim 2 wherein the active layer is 0.002 to 0.2 μm in thickness, the first and second cladding layers are each 0.2 to 3.0 μm in thickness, and the current blocking layer is 0.1 to 3.0 μm in thickness.

7. A laser diode according to claim 2 wherein the second cladding layer extends without interruption between the active layer and a cap layer.

8. A laser diode according to claim 2 wherein the second cladding layer is a single cladding layer that extends from the active layer.

9. A laser diode according to claim 2 wherein the laser diode contains a total of two cladding layers.

10. A laser diode according to claim 1 wherein the second cladding layer extends without interruption between the active layer and a cap layer.

11. A laser diode according to claim 1 wherein the second cladding layer is a single cladding layer that extends from the active layer.

12. A laser diode according to claim 1 wherein the laser diode contains a total of two cladding layers.

13. A laser diode according to claim 1 wherein the first cladding layer extends without interruption from the substrate.

14. A laser diode according to claim 2 wherein the first cladding layer extends without interruption from the substrate.

15. A laser diode according to claim 7 wherein the first cladding layer extends without interruption from the substrate.

16. A laser diode according to claim 10 wherein the first cladding layer extends without interruption from the substrate.

* * * * *